United States Patent
Itou et al.

(10) Patent No.: US 9,842,971 B2
(45) Date of Patent: Dec. 12, 2017

(54) ELECTRONIC COMPONENT MOUNTING SUBSTRATE AND LIGHT EMISSION DEVICE USING SAME

(71) Applicant: KYOCERA Corporation, Kyoto-shi, Kyoto (JP)

(72) Inventors: Seiichirou Itou, Kyoto (JP); Tetsuya Tojo, Kyoto (JP); Takeshi Oyamada, Kyoto (JP); Yoshitada Konishi, Kyoto (JP); Naoki Horinouchi, Kyoto (JP)

(73) Assignee: KYOCERA Corporation, Kyoto-shi, Kyoto (JP)

( * ) Notice: Subject to any disclaimer, the term of this patent is extended or adjusted under 35 U.S.C. 154(b) by 0 days.

(21) Appl. No.: 15/320,361

(22) PCT Filed: Sep. 24, 2015

(86) PCT No.: PCT/JP2015/076965
§ 371 (c)(1),
(2) Date: Dec. 20, 2016

(87) PCT Pub. No.: WO2016/047702
PCT Pub. Date: Mar. 31, 2016

(65) Prior Publication Data
US 2017/0207369 A1    Jul. 20, 2017

(30) Foreign Application Priority Data

| Sep. 24, 2014 | (JP) | 2014-193573 |
| May 26, 2015 | (JP) | 2015-106524 |
| Jun. 26, 2015 | (JP) | 2015-128899 |
| Aug. 20, 2015 | (JP) | 2015-162976 |

(51) Int. Cl.
*H01L 33/48* (2010.01)
*H01L 33/62* (2010.01)

(52) U.S. Cl.
CPC .......... *H01L 33/486* (2013.01); *H01L 33/62* (2013.01)

(58) Field of Classification Search
CPC .............................. H01L 33/486; H01L 33/62
USPC ........................................................ 257/99, 98
See application file for complete search history.

(56) References Cited

FOREIGN PATENT DOCUMENTS

| JP | 2007-165751 A |   | 6/2007 |
| JP | 2007165751 A | * | 6/2007 |
| JP | 2014-116351 A | * | 6/2014 |
| JP | 2015-137401 A |   | 7/2015 |
| JP | 2015137401 A | * | 7/2015 |

OTHER PUBLICATIONS

International Search Report, PCT/JP2015/076965, dated Dec. 15, 2015, 2 pgs.

* cited by examiner

*Primary Examiner* — Cuong Q Nguyen
*Assistant Examiner* — Tong-Ho Kim
(74) *Attorney, Agent, or Firm* — Volpe and Koenig, P.C.

(57) ABSTRACT

There is provided an electronic component mounting substrate which excels in resistance to migration, and is thus capable of maintaining high thermal conductivity and insulation performance for a long period of time. An electronic component mounting substrate includes: a metallic substrate formed of aluminum or an aluminum-based alloy; an alumite layer disposed on the metallic substrate, having a network of crevices at an upper surface thereof; and a ceramic layer disposed on the alumite layer, part of the ceramic layer extending into the crevices.

7 Claims, 6 Drawing Sheets

FIG. 6

ELECTRONIC COMPONENT MOUNTING SUBSTRATE AND LIGHT EMISSION DEVICE USING SAME

TECHNICAL FIELD

The present invention relates to an electronic component mounting substrate for mounting of a high heat generating component such for example as a light emitting element, and a light emission device using the electronic component mounting substrate, and more particularly relates to an electronic component mounting substrate suitably used for a vehicle-installed LED (Light Emitting Diode) lamp, and a light emission device incorporating the electronic component mounting substrate.

BACKGROUND ART

In recent years, LED lamps have come to be used for car headlights. A high-power LED chip is used for a vehicle-installed LED lamp, wherefore a substrate for the mounting of the LED chip is required to have high heat-dissipation capability. Thus, heretofore it has been customary to use an aluminum nitride substrate having high thermal conductivity for a vehicle-installed LED lamp. However, at present, there is an increasing demand for a substrate which has high thermal conductivity and yet is inexpensive to manufacture. An example of such a substrate is disclosed in Japanese Unexamined Patent Publication JP-A 2007-165751.

The substrate disclosed in JP-A 2007-165751 is constructed by forming an alumite layer on the surface of an aluminum substrate, forming cracks in the alumite layer by, for example, application of thermal stress, and forming a thermally-conductive resin insulating layer on the surface of the crack-bearing alumite layer.

However, the thermally-conductive resin insulating layer is formed of resin and thus exhibits hygroscopicity, wherefore ion migration may occur. Furthermore, due to a large difference in thermal expansion coefficient between resin and alumite, the alumite layer and the thermally-conductive resin insulating layer may be separated from each other under thermal history, which results in deterioration in thermal conductivity.

The invention has been devised in view of the problems as discussed supra, and accordingly an object thereof is to provide an electronic component mounting substrate which excels in resistance to migration, and is thus capable of maintaining high thermal conductivity and insulation performance for a long period of time, and also provide a light emission device using the electronic component mounting substrate.

SUMMARY OF INVENTION

An electronic component mounting substrate according to an embodiment of the invention comprises: a metallic substrate formed of aluminum or an aluminum-based alloy; an alumite layer disposed on the metallic substrate, having a network of crevices at an upper surface thereof; and a ceramic layer disposed on the alumite layer, part of the ceramic layer extending into the crevices.

A light emission device according to an embodiment of the invention comprises: the electronic component mounting substrate mentioned above; and a light emitting element mounted on the electronic component mounting substrate.

BRIEF DESCRIPTION OF DRAWINGS

FIG. 2(a) shows the metallic substrate, FIG. 2(b) shows the metallic substrate with the alumite layer formed on one side thereof, FIG. 2(c) shows the alumite layer with the crevices formed at an upper surface thereof, and FIG. 2(d) shows the alumite layer with the ceramic layer formed thereon;

FIG. 4(a) represents an example of the structure, and FIG. 4(b) represents a modified example of the structure depicted in FIG. 4(a);

DESCRIPTION OF EMBODIMENTS

Figure 1:
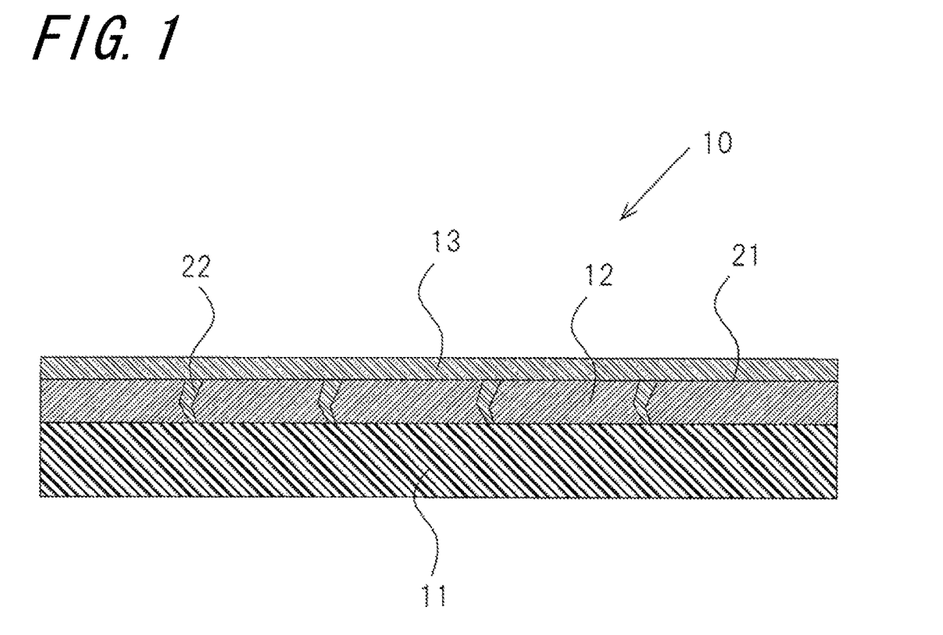
FIG. 1 is a sectional view showing the structure of an electronic component mounting substrate in accordance with an embodiment of the invention.

FIG. 1 is a sectional view showing the structure of an electronic component mounting substrate 10 in accordance with an embodiment of the invention. The electronic component mounting substrate 10 is configured for dissipation of heat to the outside, and more specifically, is used for mounting of a LED lamp. One particular application of the electronic component mounting substrate 10 is to mounting of a vehicle-installed LED lamp. When applied to a vehicle-installed headlight, the LED lamp needs to be designed to emit light in a larger amount, and, in addition to the increase of the amount of light emission, as contrasted to a LED lamp mounted in a common portable terminal or the like, the LED lamp generates a larger amount of heat. Thus, to dissipate heat to the outside efficiently, the electronic component mounting substrate 10 in accordance with an embodiment of the invention is used. The electronic component mounting substrate 10 according to this embodiment comprises: a metallic substrate 11 formed of aluminum or an aluminum-based alloy; an alumite layer 12, formed on the metallic substrate 11, having a network of crevices 22 at an upper surface 21 thereof; and a ceramic layer 13 which covers the alumite layer 12 formed on the alumite layer 12, part of which extends into the crevices 22.

Figure 2:
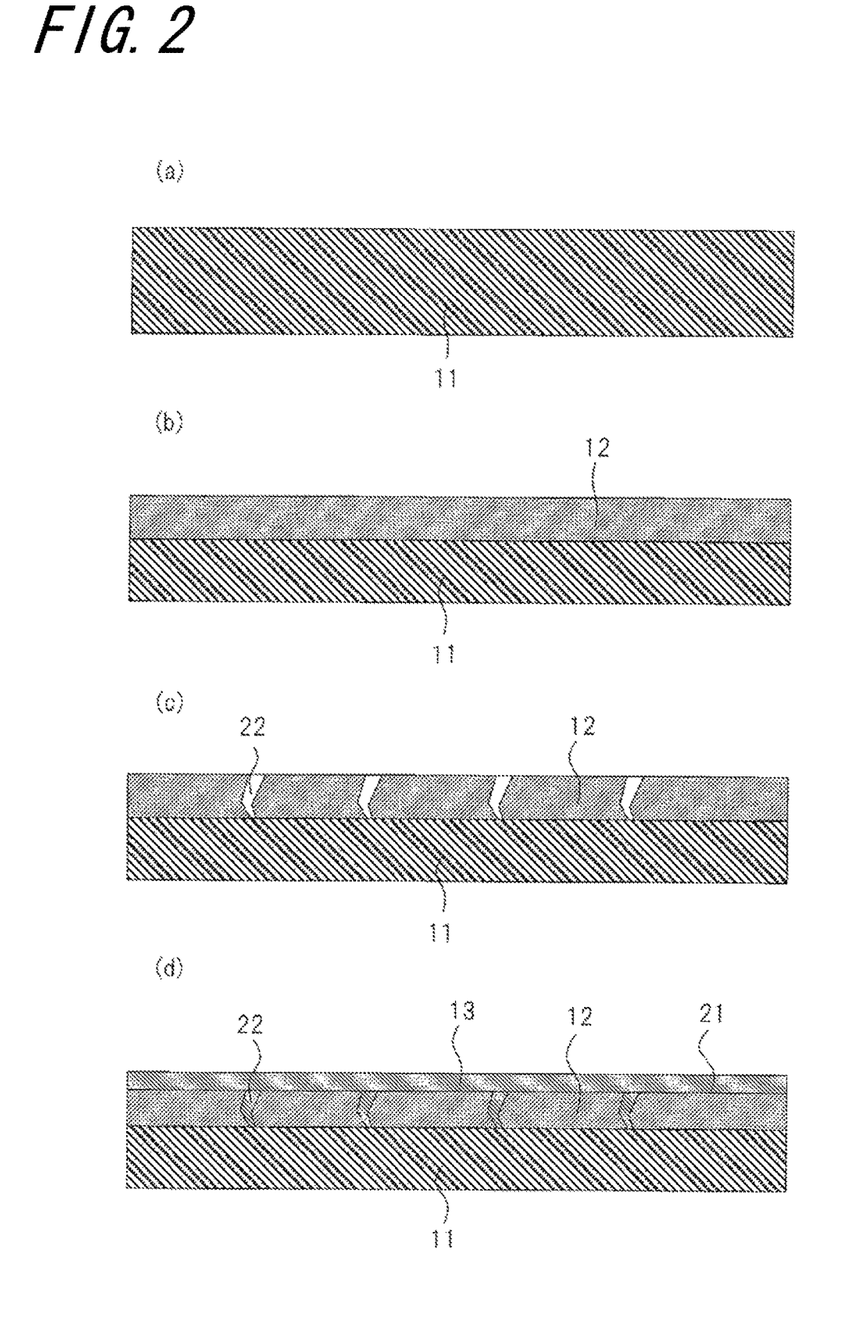
FIG. 2 is a sectional view showing an example of procedures in the manufacture of the electronic component mounting substrate in accordance with the present embodiment of the invention, and more specifically

FIG. 2 is a sectional view showing an example of procedures in the manufacture of the electronic component mounting substrate 10 in accordance with the present embodiment of the invention. FIG. 2(a) shows the metallic substrate 11. The metallic substrate 11 is a plate-like body formed of a metal material such as aluminum or an aluminum-based alloy. Preferred examples of the aluminum-based alloy include an Al—Cu alloy, an Al—Mn alloy, an Al—Si alloy, an Al—Mg alloy, an Al—Mg—Si alloy, and an Al—Zn—Mg alloy. A metal plate body having a thickness of 0.3 [mm] or more and 5 [mm] or less is suitably used as the metallic substrate 11. The metallic substrate 1 having a thickness of 0.3 [mm] or more is capable of effectively absorbing heat emanating from a LED lamp and readily dissipating the heat to the outside. Moreover, the metallic substrate 1 having a thickness of 5 [mm] or less affords the advantage of allowing a wiring board to be made lower in profile while providing similar effects to those produced by a heat-radiating plate.

FIG. 2(b) shows the metallic substrate 11 depicted in FIG. 2(a), with the alumite layer 12 formed on one side in the thickness direction thereof. The alumite layer 12 is formed by anodizing the above-described one side of the metallic substrate 11 in a treatment bath of electrolyte such as sulfuric acid or oxalic acid.

The thickness of the alumite layer 12 can be adjusted by making adjustment to electrolysis conditions to be fulfilled in the anodization process. For example, the thickness is adjusted to fall in a range of 3 [μm] or more and 20 [μm] or less. The thickness of the alumite layer 12 corresponds to the thickness of other part of the alumite layer 12 than the part formed with the crevices 22 that will hereafter be described. The alumite layer 12 having a thickness of 3 [μm] or more affords the advantage of raising the level of insulation relative to the metallic substrate 11. Moreover, the alumite layer 12 having a thickness of 20 [μm] or less affords the advantage of enhancing the thermal conductivity of the electronic component mounting substrate 10.

Figure 6:
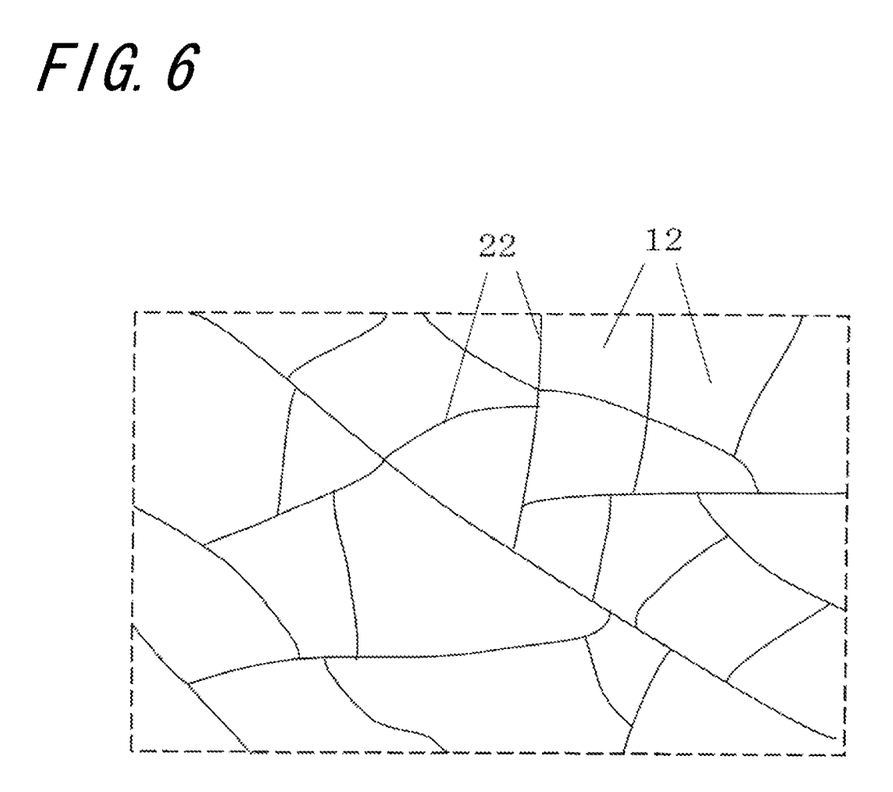
FIG. 6 is a plan view showing an example of a network of crevices formed at the upper surface of an alumite layer.

FIG. 2(c) shows the alumite layer 12 depicted in FIG. 2(b), with the crevices 22 formed at the upper surface 21, or equivalently a surface of the alumite layer 12 opposite to the metallic substrate 11-side surface. The crevices 22 are formed so as to open into the upper surface 21 of the alumite layer 12. A network of the crevices 22 is formed intentionally. The crevices 22 may be formed by subjecting a plurality of minute holes formed at the surface of the alumite layer 12 to mechanical shock, or may be formed through application of thermal stress (thermal shock) entailed by a temperature change which is greater in extent than the temperature change expected during the use of the electronic component mounting substrate. The intentional formation of the crevices 22 in the alumite layer 12 makes it possible to release the internal stress on the alumite layer 12 in the absence of the crevices 22. Note that the depth of some crevices 22 is equivalent to the thickness of the alumite layer 12. As shown in FIG. 6, a network of the crevices 22 refers to voids or cracks, and is also construed as encompassing a plurality of branched portions of a single crevice.

FIG. 2(d) shows the alumite layer 12 depicted in FIG. 2(c), with the ceramic layer 13 formed thereon. The ceramic layer 13 is formed by a technique such for example as the sol-gel method. According to the sol-gel method, a slurry is prepared as a key ingredient of the ceramic layer 13, and, the slurry is coated on the upper surface 21 of the alumite layer 12 by a coating technique such as the dip coating method or the spray coating method. After that, the coating and the metallic substrate 11 are heated altogether at temperatures ranging from, for example, 100 [° C.] or above to 300 [° C.] or below, whereupon the coating is cured. In this way, the ceramic layer 13 which covers the upper surface 21 of the alumite layer 12 is formed, with part thereof extending into the crevices 22. From the standpoint of ensuring higher level of insulation for the surface of the metallic substrate 11, as shown in FIG. 1, the ceramic layer 13 fully fills the crevices 22 so as to cover the surface of the metallic substrate 11 exposed at the crevices 22.

Thus, when entering at least a vicinity of the opening of the crevices 22, the ceramic layer 13 structurally reinforces the alumite layer 12. This makes it possible to inhibit further formation of cracks in the alumite layer 12 caused by, for example, temperature changes, and thereby maintain the insulation for the surface of the metallic substrate 11 for a long period of time. It is preferable that part of the ceramic layer 13 fills the crevices 22 formed so as to reach the interface between the metallic substrate 11 and the alumite layer 12. In the case where the ceramic layer 13 extends into the crevices 22, air in the crevices 22 is reduced, thus minimizing deterioration in insulation at the surface of the metallic substrate 11 caused by moisture content in the air. Moreover, the strength of adhesion between the ceramic layer 13 and the alumite layer 12 is increased, wherefore the ceramic layer 13 becomes resistant to separation even when undergoing thermal contraction or thermal expansion.

In this embodiment, the ceramic layer 13 is formed of a mixture of alumina and silica. This makes it possible to lower the heating temperature in the process of forming the ceramic layer 13, and thereby produce the electronic component mounting substrate 10 characterized by small thermal stress and high reliability. Moreover, with the alumina content, the ceramic layer 13 lying within the crevices 22 is similar in crystalline structure to the alumite layer 12. This makes it possible to produce the electronic component mounting substrate 10 having higher thermal conductivity.

For example, the alumina-silica mixture can be prepared by blending alkoxysilane with a slurry formed of alumina powder, silica powder, alcohol, and water. The mixture is subjected to hydrolysis and polycondensation reaction to form the ceramic layer 13 formed of alumina and silica. For example, the mixing ratio of alumina to silica is set at 10:90. Moreover, instead of alumina powder and silica powder, for example, zirconia powder may be added for adjustment of coefficients of thermal expansion.

It is preferable that the thickness of the ceramic layer 13 is adjusted to fall in a range of 0.5 [μm] or more and 10 [μm] or less. The ceramic layer 13 having a thickness of 0.5 [μm] or more is capable of filling the plurality of crevices 22 formed in the alumite layer 12. Moreover, the ceramic layer 13 having a thickness of 20 [μm] or less affords the advantage of enhancing the thermal conductivity of the electronic component mounting substrate 10.

The ceramic layer 13 is provided with a recess 13b located so as to overlap with the crevices 22. In this structure, a wiring conductor 14 can be disposed on the principal surface of the ceramic layer 13 while lying within the recess 13b. Thus, when an electronic apparatus is activated, even if stress is applied due to the difference in thermal expansion coefficient between the metallic substrate 11 and the wiring conductor 14, the stress can be dispersed by a part of the wiring conductor 14 which corresponds to the recess 13b and the crevices 22, thus restraining the wiring conductor 14 from separating from the electronic component mounting substrate 10. Moreover, in the ceramic layer 13, the recess 13b is formed so as to overlap with the crevices 22. This makes it possible to compensate for a decrease in the thickness of a part of the ceramic layer 13 which is provided with the recess 13b, and thereby render a part of the ceramic layer 13 which corresponds to the recess 13b resistant to cracking or the like, thus preventing separation of the ceramic layer 13. The width and depth of the recess 13b can be changed by suitably adjusting, for example, the viscosity of the alumina-silica mixture which constitutes the ceramic layer 13.

Although the recess 13b may be made larger in width than the crevices 22 as shown in FIG. 4(a), by making the recess 13b smaller in width than the crevices 22 as shown in FIG. 4(b), it is possible to effectively reduce a decrease in the thickness of a part of the ceramic layer 13 which bears the recess 13b, and thereby render the part of the ceramic layer 13 which corresponds to the recess 13b more resistant to cracking or the like, thus preventing separation of the ceramic layer 13.

The wiring conductor 14 is disposed on the ceramic layer 13, and a light emitting element 2 such as a light emitting device is mounted thereon. For example, the wiring conductor 14 comprises a tightly-adherent metallic layer and a barrier layer. The tightly-adherent metallic layer constituting the wiring conductor 14 is disposed on the ceramic layer 13. The tightly-adherent metallic layer is formed of, for example, tantalum nitride, a nickel-chromium material, a nickel-chromium-silicon material, a tungsten-silicon material, a molybdenum-silicon material, tungsten, molybdenum, titanium, or chromium. The tightly-adherent metallic layer is deposited on the ceramic layer 13 by a thin-film forming technique such as vapor deposition, ion plating, or sputtering.

For example, in the case of forming the tightly-adherent metallic layer by vacuum deposition, the metallic substrate 11 formed with the alumite layer 12 and the ceramic layer 13 is set in a film-forming chamber of a vacuum evaporator, and, a metal piece for constituting the tightly-adherent metallic layer is placed at an evaporation source in the film-forming chamber. After that, the interior of the film-forming chamber is vacuumed (under pressure of $10^{-2}$ Pa or below), and, the metal piece placed at the evaporation source is evaporated under heat. The molecules of the evaporated metal piece are deposited onto the metallic substrate 11 provided with the alumite layer 12 and the ceramic layer 13, whereupon the tightly-adherent metallic layer is formed. Moreover, following the formation of a resist pattern using photolithography on the metallic substrate 11 provided with the tightly-adherent metallic layer, an excess of the tightly-adherent metallic layer is removed by etching. On the upper surface of the tightly-adherent metallic layer is laminated the barrier layer which exhibits good adherability and wettability relative to the tightly-adherent metallic layer and a plating layer, and serves to join the tightly-adherent metallic layer with the plating layer firmly, as well as to suppress mutual diffusion of the tightly-adherent metallic layer and the plating layer. The barrier layer is formed of, for example, a nickel-chromium material, platinum, palladium, nickel, or cobalt. The barrier layer is deposited on the surface of the tightly-adherent metallic layer by a thin-film forming technique such as vapor deposition, ion plating, or sputtering.

It is advisable that the thickness of the tightly-adherent metallic layer falls in a range of about 0.01 to 0.5 [µm]. If the thickness of the tightly-adherent metallic layer is less than 0.01 [µm], it is prone to be difficult to cause the tightly-adherent metallic layer to adhere to the ceramic layer 13 firmly. On the other hand, if the thickness of the tightly-adherent metallic layer exceeds 0.5 [µm], the tightly-adherent metallic layer will be prone to separation under internal stress applied during the tightly-adherent metallic layer-forming process. Moreover, it is advisable that the thickness of the barrier layer falls in a range of about 0.05 to 1 [µm]. If the thickness of the barrier layer is less than 0.05 [µm], the barrier layer may suffer defects such as pinholes and is less prone to serve the intended purposes. On the other hand, if the thickness of the barrier layer exceeds 1 [µm], the barrier layer will be prone to separation under internal stress applied during the barrier layer-forming process.

Moreover, a metal layer composed of copper, gold or the like may be put on the barrier layer to achieve satisfactory metallic-layer formation on the wiring conductor 14. Such a metal layer is formed in a manner similar to the wiring conductor 14-forming process.

The metallic layer is formed by laminating a plating layer formed of copper or silver on the wiring conductor 14 disposed on the metallic substrate 11 via the alumite layer 12 and the ceramic layer 13. The metallic layer conducts heat to a greater extent when formed of a material which is higher in thermal conductivity than the material of construction of the wiring conductor 14.

A metallic plating layer is deposited on the exposed surface of the wiring conductor 14 by electroplating or electroless plating. The metallic plating layer is formed of a metal which excels in corrosion resistance and in connection with a connecting member 3, such as nickel, gold, or silver. For example, a nickel plating layer having a thickness of about 0.5 to 5 [µm] and a gold plating layer having a thickness of about 0.1 to 3 [µm], or a nickel plating layer having a thickness of about 1 to 10 [µm] and a silver plating layer having a thickness of about 0.1 to 1 [µm], are successively deposited. This makes it possible to retard corrosion in the wiring conductor 14 effectively, as well as to strengthen the connection between the wiring conductor 14 and the light emitting element 2, or the connection between the wiring conductor 14 and the connecting member 3 such as a metal bump or bonding wire, and the connection between the wiring conductor 14 and a connecting pad 41 formed on a module substrate 4.

A region of the ceramic layer 13 located on the alumite layer 12 side is higher in hardness than a region of the ceramic layer 13 located on the wiring conductor 14 side. With such a design, when an external force such as stress is applied to the electronic component mounting substrate 10 in the case of mounting the light emitting element 2, the stress is absorbed by the wiring conductor 14-side region of the ceramic layer 13 having lower hardness, and, a residue of the stress unabsorbed is dispersed by the alumite layer 12-side region of the ceramic layer 13 having higher hardness. This makes it possible to reduce occurrence of cracking, deformation, or the like in the alumite layer 12. For example, the hardness of the principal-surface side of the ceramic layer 13 falls in a range of 0.5 [GPa] to 1.8 [GPa], whereas the hardness of the other-surface side of the ceramic layer 13 falls in a range of 1.8 [GPa] to 2.5 [GPa]. The hardness of the ceramic layer 13 may be measured with use of a nano indenter.

To form the ceramic layer 13 in which the alumite layer 12-side region is higher in hardness than the wiring conductor 14-side region, for example, a coating of the slurry which constitutes the ceramic layer 13 is formed on the principal surface (upper surface) of the alumite layer 12 by the above-described coating technique, and, in the above-described subsequent heating process to cure the coating, heat is applied so as to be transmitted to the alumite layer 12 first. In another alternative, a plurality of layers of the ceramic layer 13-constituting slurry may be individually formed on the principal surface (upper surface) of the alumite layer 12 by the above-described coating technique. In this case, the individual layers are each heated to cure during its formation.

Moreover, it is advisable that the ceramic layer 13 is so configured that its hardness becomes higher gradually from the wiring conductor 14-side region to the alumite layer 12-side region. In this case, when an external force such as stress is applied to the electronic component mounting substrate 10 in the case of mounting the light emitting element 2, the stress is absorbed by the wiring conductor 14-side region of the ceramic layer 13 having lower hardness, and, even if some stress is unabsorbed, since the hardness becomes higher gradually toward the alumite layer 12-side region, the residual stress can be effectively dispersed over an area between the wiring conductor 14-side region and the alumite layer 12-side region in the ceramic layer 13. This makes it possible to reduce occurrence of cracking, deformation, or the like in the alumite layer 12 more effectively.

It is advisable that, in a portion of the ceramic layer 13 disposed in the crevices 22, a part thereof located on the sidewall side of the crevices 22 is higher in hardness than a part thereof located on the midportion side of the crevices 22. In this case, when an external force such as stress is applied to a part of the electronic component mounting substrate 10 which overlaps with the crevices 22 as seen in a plan view in the case of mounting the light emitting element 2, the stress is absorbed by the wiring conductor 14-side region of the ceramic layer 13 having lower hardness and the part located on the midportion side of the crevices 22 having lower hardness, and, a residue of the stress unabsorbed is dispersed by the part located on the sidewall side of the crevices 22 having higher hardness. This makes it possible to reduce occurrence of cracking, deformation, or the like in the crevices 22 of the alumite layer 12. In the portion of the ceramic layer 13 disposed in the crevices 22, for example, the hardness of the part located on the midportion side of the crevices 22 falls in a range of 0.5 [GPa] to 1.8 [GPa], whereas the hardness of the part located on the sidewall side of the crevices 22 falls in a range of 1.8 [GPa] to 2.5 [GPa].

It is advisable that the portion of the ceramic layer 13 disposed in the crevices 22 is so configured that its hardness becomes higher gradually from the part located on the midportion side of the crevices 22 to the part located on the sidewall side of the crevices 22. In this case, when an external force such as stress is applied to a part of the electronic component mounting substrate 10 which overlaps with the crevices 22 as seen in a plan view in the case of mounting the light emitting element 2, the stress is absorbed by the wiring conductor 14-side region of the ceramic layer 13 having lower hardness and the part located on the midportion side of the crevices 22 having lower hardness, and, even if some stress is unabsorbed, since the hardness becomes higher gradually from the part located on the midportion side of the crevices 22 to the part located on the sidewall side of the crevices 22, the residual stress can be effectively dispersed over an area between the part located on the midportion side of the crevices 22 and the part located on the sidewall side of the crevices 22. This makes it possible to reduce occurrence of cracking, deformation, or the like in the alumite layer 12 more effectively.

Moreover, the ceramic layer 13 contains Si—O bond, and, in the ceramic layer 13, the other principal surface side is higher in Si—O bond concentration than the principal surface side, and the alumite layer 12-side region is higher in hardness than the wiring conductor 14-side region correspondingly. Thus, when an external force such as stress is applied to the electronic component mounting substrate 10 in the case of mounting the light emitting element 2, the stress is absorbed by the wiring conductor 14-side region of the ceramic layer 13, and, a residue of the stress unabsorbed is dispersed by the alumite layer 12-side region of the ceramic layer 13. This makes it possible to effectively reduce occurrence of cracking, deformation, or the like in the alumite layer 12. Note that the hardness of the ceramic layer 13 depends on the ratio between a three-membered ring and a poly-membered ring in Si—O bond of the ceramic layer 13. For example, the ceramic layer 13 in which the ratio between a three-membered ring and a poly-membered ring falls in a range of from 100:100 to less than 100:115 is a hard layer having a high hardness, and, the ceramic layer 13 in which the ratio between a three-membered ring and a poly-membered ring is 100:115 or more is a soft layer having a low hardness.

Thus, the electronic component mounting substrate 10 in this embodiment is constructed by forming, on the alumite layer 12, the ceramic layer 13 which covers the alumite layer 12, with part thereof extending into a network of crevices 22 formed at the upper surface 21 of the alumite layer 12. In this case, as contrasted to a case where the alumite layer 12 is covered with a resin-made layer, it is possible to attain the electronic component mounting substrate 10 which excels in migration resistance.

Figure 4:
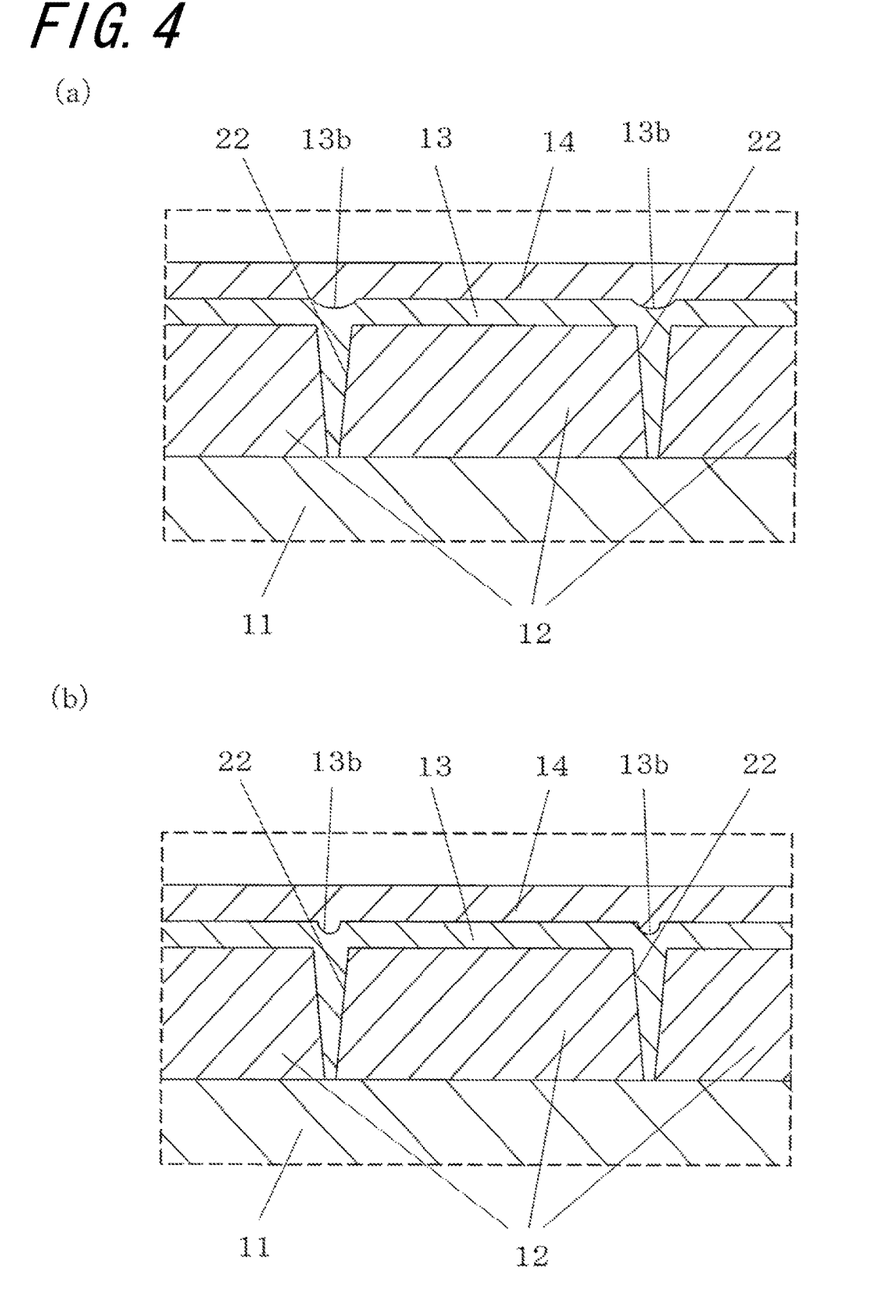
FIG. 4 is an enlarged sectional view showing the structure of a part A of the electronic component mounting substrate depicted in FIG. 3, and more specifically
Figure 5:
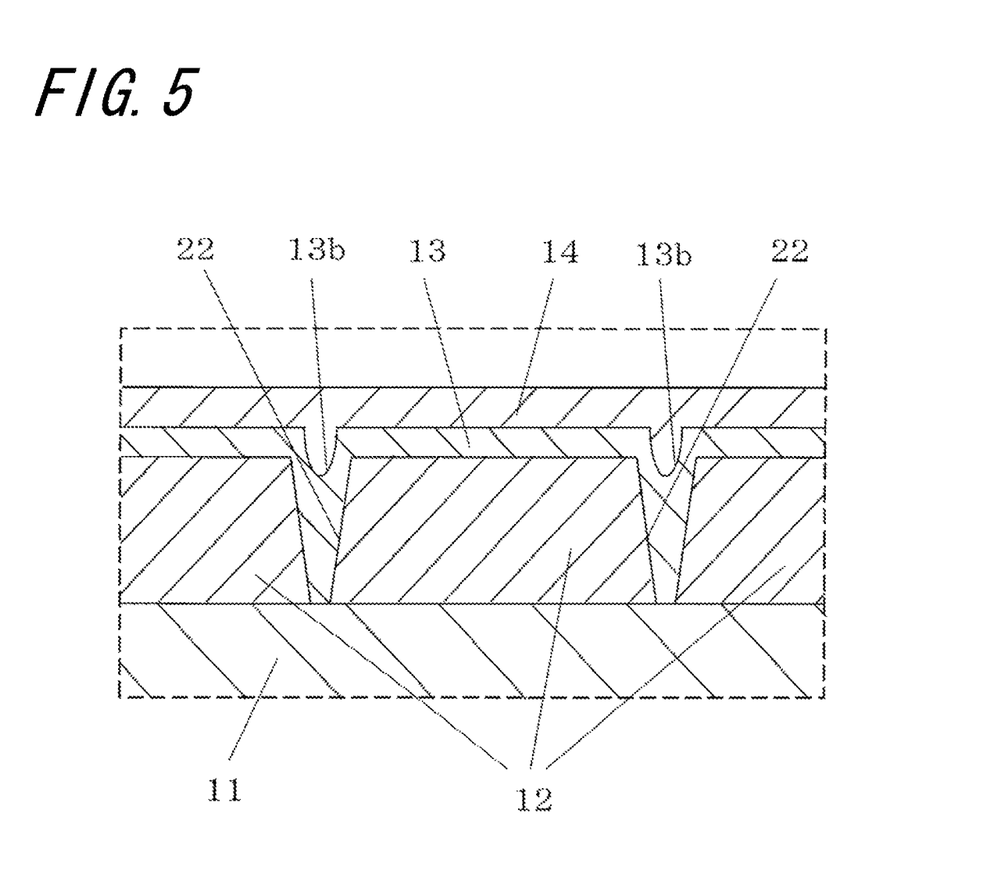
FIG. 5 is an enlarged sectional view showing another example of the structure of the part A of the electronic component mounting substrate depicted in FIG. 3.

As shown in FIGS. 4 and 5, by forming the recess 13b so as to extend from the principal surface (upper surface) of the ceramic layer 13 to the inside of the crevices 22, the wiring conductor 14 can be disposed on the principal surface of the ceramic layer 13 while lying within the recess 13b, as well as lying further within the crevices 22. Thus, when the electronic apparatus is activated, even if stress is applied due to the difference in thermal expansion coefficient between the metallic substrate 11 and the wiring conductor 14, the stress can be effectively dispersed by a part of the wiring conductor 14 which corresponds to the recess 13b and the crevices 22, thus restraining the wiring conductor 14 from separating from the electronic component mounting substrate 10 more effectively.

Moreover, by disposing the recess 13b in the ceramic layer 13, the wiring conductor 14 can be disposed on the principal surface of the ceramic layer 13 while lying within the recess 13b. Thus, when the electronic apparatus is activated, even if stress is applied due to the difference in thermal expansion coefficient between the metallic substrate 11 and the wiring conductor 14, the stress can be dispersed by a part of the wiring conductor 14 which corresponds to the recess 13b and the crevices 22 more effectively, thus restraining the wiring conductor 14 from separating from the electronic component mounting substrate 10 more effectively.

Moreover, there is also a network of the recesses 13b as seen in a plan view, wherefore the wiring conductor 14, being disposed on the principal surface of the ceramic layer 13 while lying within the recess 13b, has a network configuration. Thus, when the electronic apparatus is activated, even if stress is applied due to the difference in thermal expansion coefficient between the metallic substrate 11 and the wiring conductor 14, the stress can be effectively dispersed by a part of the wiring conductor 14 which corresponds to the recess 13b and the crevices 22, thus restraining the wiring conductor 14 from separating from the electronic component mounting substrate 10 more effectively. Moreover, even if an external force is applied to the wiring conductor 14 in a horizontal direction during handling of the construction, effective stress dispersion can be achieved by the part of the wiring conductor 14 which corresponds to the recess 13b and the crevices 22 in network configuration, thus restraining the wiring conductor 14 from separating from the electronic component mounting substrate 10 effectively.

Moreover, there are provided the recesses 13b all over the alumite layer 12. Thus, when the electronic apparatus is activated, even if stress is applied due to the difference in thermal expansion coefficient between the metallic substrate 11 and the wiring conductor 14, the stress can be effectively dispersed by parts of the entire wiring conductor 14 corresponding to the recesses 13b and the crevices 22, thus restraining the wiring conductor 14 from separating from the electronic component mounting substrate 10 effectively. Moreover, even if an external force is applied to the wiring conductor 14 in the horizontal direction during handling of the construction, effective stress dispersion can be achieved by the parts of the entire wiring conductor 14 corresponding to the recesses 13b and the crevices 22, thus restraining the wiring conductor 14 from separating from the electronic component mounting substrate 10 effectively.

Moreover, even if a high-heat-generating component such as the light emitting element is mounted, as contrasted to the case of covering the alumite layer 12 with a resin-made layer, separation between the alumite layer 12 and the ceramic layer 13 is less likely to occur, wherefore high thermal conductivity can be ensured for a long period of time. In addition, the manufacture can be accomplished at lower cost than would be the case of using an aluminum nitride substrate.

Figure 3:
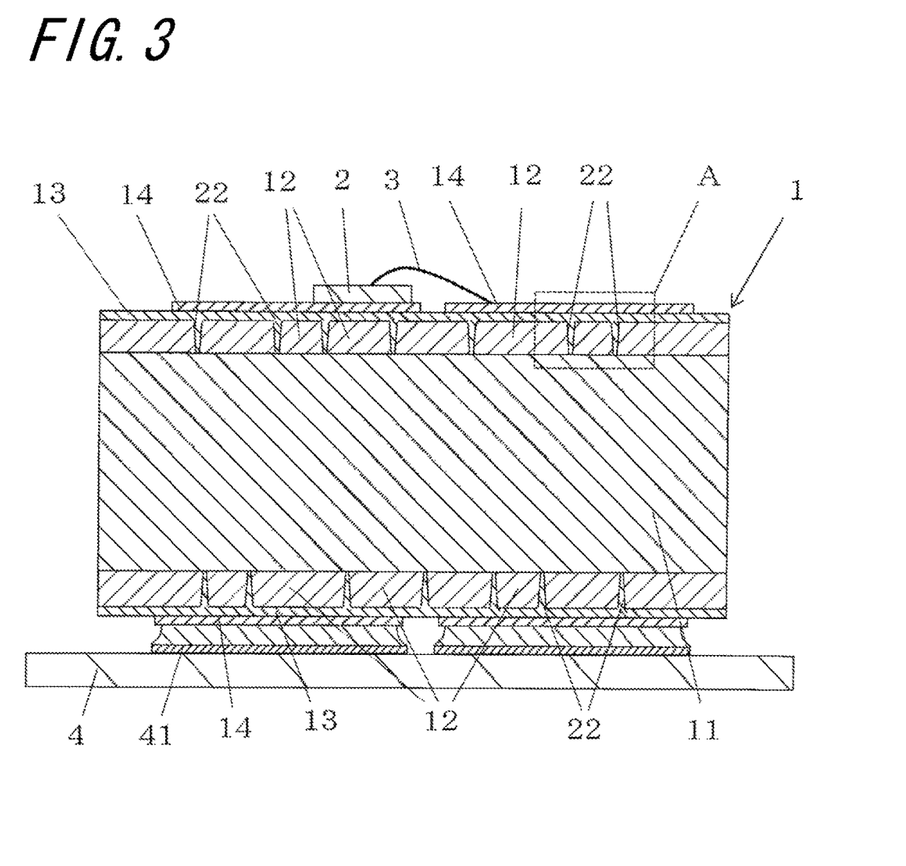
FIG. 3 is a sectional view showing an embodiment of a light emission device constructed of the electronic component mounting substrate shown in FIG. 1 with the light emitting element mounted thereon.

FIG. 3 is a sectional view showing an embodiment of a light emission device 1 constructed of the electronic component mounting substrate 10 shown in FIG. 1 with the light emitting element 2 mounted thereon. In the light emission device 1 shown in FIG. 3, the wiring conductor 14 is formed on the ceramic layer 13 constituting the electronic component mounting substrate 10, the light emitting element 2 is mounted, via a connecting pad 41 which is a Au (gold) bump, on the wiring conductor 14, and the wiring conductor 14 and a lead frame 3 are electrically joined to each other. For example, the light emitting element 2 is implemented by an LED chip.

The light emission device 1 according to this embodiment is suitably used for a vehicle-installed LED lamp. That is, even if a high-power LED chip is mounted in the light emission device 1, by virtue of the incorporation of the electronic component mounting substrate 10 shown in FIG. 1 as a substrate for mounting the light emitting element 2 thereon, the light emission device 1 is capable of providing high thermal conductivity for a long period of time, and is also capable of maintaining the insulation performance of the ceramic layer 13 for a long period of time, because the ceramic layer 13 is free of quality degradation caused by phosphorus and so forth contained in an exhaust gas emitted from a car.

The invention claimed is:

1. An electronic component mounting substrate, comprising:
   a metallic substrate formed of aluminum or an aluminum-based alloy;
   an alumite layer disposed on the metallic substrate, having a network of crevices at an upper surface thereof; and
   a ceramic layer disposed on the alumite layer, part of the ceramic layer extending into the crevices,
   the ceramic layer having a recess formed at an upper surface thereof so as to overlap with the crevices.

2. The electronic component mounting substrate according to claim 1, wherein the ceramic layer is formed of a mixture of alumina and silica.

3. The electronic component mounting substrate according to claim 1, wherein the crevices reach an interface between the metallic substrate and the alumite layer.

4. The electronic component mounting substrate according to claim 1, further comprising a wiring conductor which is disposed on the ceramic layer and on which a light emitting element is mounted,
   wherein a region of the ceramic layer located on an alumite layer side is higher in hardness than a region of the ceramic layer located on a wiring conductor side.

5. The electronic component mounting substrate according to claim 1, wherein a thickness of the ceramic layer, exclusive of the part of the ceramic layer extending into the crevices, falls in a range of 0.5 µm or more and 20 µm or less.

6. The electronic component mounting substrate according to claim 1, wherein a thickness of the alumite layer, exclusive of a part of the alumite layer provided with the crevices, falls in a range of 3 µm or more and 20 µm or less.

7. A light emission device, comprising:
   the electronic component mounting substrate according to claim 1; and
   a light emitting element mounted on the electronic component mounting substrate.

* * * * *